(12) United States Patent
Singh et al.

(10) Patent No.: US 6,501,534 B1
(45) Date of Patent: Dec. 31, 2002

(54) AUTOMATED PERIODIC FOCUS AND EXPOSURE CALIBRATION OF A LITHOGRAPHY STEPPER

(75) Inventors: Bhanwar Singh, Morgan Hill, CA (US); Ramkumar Subramanian, Sunnyvale, CA (US); Bharath Rangarajan, Santa Clara, CA (US); Carmen Lapid Morales, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 61 days.

(21) Appl. No.: 09/845,375

(22) Filed: Apr. 30, 2001

(51) Int. Cl.[7] .............................................. G03B 27/52
(52) U.S. Cl. .............................. 355/55; 355/63; 355/53
(58) Field of Search ........................... 355/52, 53, 54, 355/55, 61, 62, 63, 67, 69

(56) References Cited

U.S. PATENT DOCUMENTS

| | | | |
|---|---|---|---|
| 5,700,602 A | * 12/1997 | Dao et al. ...................... 430/22 |
| 5,867,276 A | 2/1999 | McNeil et al. | |
| 5,889,593 A | 3/1999 | Bareket | |
| 5,912,741 A | * 6/1999 | Carter et al. ................. 356/445 |
| 5,929,977 A | * 7/1999 | Ozawa ........................ 355/53 |
| 5,955,654 A | 9/1999 | Stover et al. | |
| 6,016,684 A | 1/2000 | Scheer et al. | |
| 6,388,253 B1 | * 5/2002 | Su ........................... 250/252.1 |

* cited by examiner

*Primary Examiner*—Russell Adams
*Assistant Examiner*—D. Ben Esplin
(74) *Attorney, Agent, or Firm*—Eschweiler & Associates, LLC

(57) ABSTRACT

The present invention is directed to a system and a method for calibrating a lithography stepper system. The system includes a lithography stepper system, measurement system such as a scatterometry system, and a processor for correlating an ideal "golden standard" characterization signature to a test structure characterization data set, based on a plurality of focus and exposure conditions.

31 Claims, 8 Drawing Sheets

AUTOMATED PERIODIC FOCUS AND EXPOSURE CALIBRATION OF A LITHOGRAPHY STEPPER

TECHNICAL FIELD OF INVENTION

The present invention relates generally to the fabrication of a semiconductor device and more particularly to a system and a method for characterizing lithography test structures formed using a stepper system and using that information to calibrate focus and exposure settings of the stepper system.

BACKGROUND OF THE INVENTION

In the semiconductor industry, there is a continuing trend toward higher device densities. To achieve these high densities there has been and continues to be efforts toward scaling down device dimensions (e.g., at submicron levels) on semiconductor wafers. In order to accomplish such high device packing density, smaller and smaller feature sizes are required. This may include the width and spacing of interconnecting lines, spacing and diameter of contact holes, and the surface geometry such as corners and edges of various features.

The requirement of small features with close spacing between adjacent features requires high resolution lithographic processes. In general, lithography involves the transfer of a pattern or image from one medium to another, as from a mask to a wafer. In particular, a mask can be used to shield one area of the wafer while exposing another in a lithography stepper system. For example, a photoresist is applied to a wafer which is then aligned to a mask. Then, an illumination source such as ultraviolet or x-ray radiation can be projected through the mask, thereby exposing the photoresist with the mask pattern. The wafer is then indexed, or "stepped" via a wafer stage system, and the image transfer is repeated at another location on the wafer. The wafer is then developed to remove the exposed photoresist and baked to harden the remaining photoresist pattern. Areas of the wafer not covered by the hardened photoresist are then etched away or otherwise processed, and the wafer is inspected to ensure the image transfer from the mask to the top layer is correct. This process is repeated several times until all of the active devices and features have been formed.

During the image transfer process of fabricating a semiconductor, many variables can affect the critical dimensions of fabricated features on the wafer. Specifications must be held within very close tolerances to meet device performance requirements, thus requiring precise adjustment of system variables. Calibration of variables within a lithography stepper system based upon an ideal control standard is typically required on a periodic basis to achieve a uniform process. For example, an in-house control specimen, or "golden standard", can act as a base precision standard, from which process parameters can be adjusted to account for variations in the system. The calibration using the "golden standard" is typically performed manually, and can be subjective and time consuming. In an exemplary manual calibration procedure, test structures are exposed and developed on a test wafer with multiple focus and/or exposure conditions. The test wafer is then inspected via optical microscope and compared to an ideal standard. Upon visual analysis, if a perceived disparity occurs between the test wafer and the ideal standard, a correction is made to the focus and/or exposure settings and the procedure is repeated. Thus, due to the manual calibration inefficiencies and subjectivity, an efficient and objective means for calibration of the lithography stepper system utilizing an ideal, or "golden standard" is desired to increase precision in the image transfer process.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention generally relates to the fabrication of a semiconductor device and more particularly to a system and a method for characterizing lithography test structures formed using a stepper system. The characterization information is used in conjunction with information from a predetermined ideal standard to calibrate focus and exposure settings of the stepper system.

The calibration of focus and exposure settings in a lithography stepper system can vary the structural profile of features formed on a wafer and thus affect an overall performance of a semiconductor device. Defective features may result in reduced performance of the semiconductor device. Thus, there is a need to accurately calibrate the focus and exposure settings of a stepper system before the actual production runs of wafers begins. According to one aspect of the invention, a calibration is accomplished by obtaining information from generated calibration test structures (e.g., gratings) from the stepper system for a variety of focus and exposure conditions and comparing the information to an ideal sample or "golden standard" in order to ascertain an optimal focus and exposure condition and thereby increase the quality and precision of a fabrication process prior to production runs.

The present invention is directed to a system and a method for calibrating focus and exposure settings in a lithography stepper system. A stepper system is employed to print a plurality of test structures (e.g., a grating), at a variety of focus and exposure conditions. The generated plurality of test structures are further developed, wherein each has feature characteristics which are a function of their associated focus and exposure conditions. Each of the test structures is then measured and characterized, for example, using scatterometry, to generate characterization data associated therewith. The characterization data is then compared to data representing ideal feature characteristics (e.g., a "golden standard" data set) via, for example, a correlation to determine an optimal focus and exposure condition according to a predetermined criteria. Calibrating the focus and exposure conditions to an ideal "golden standard" at the beginning of a production run facilitates achieving desired critical dimensions at production startup.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
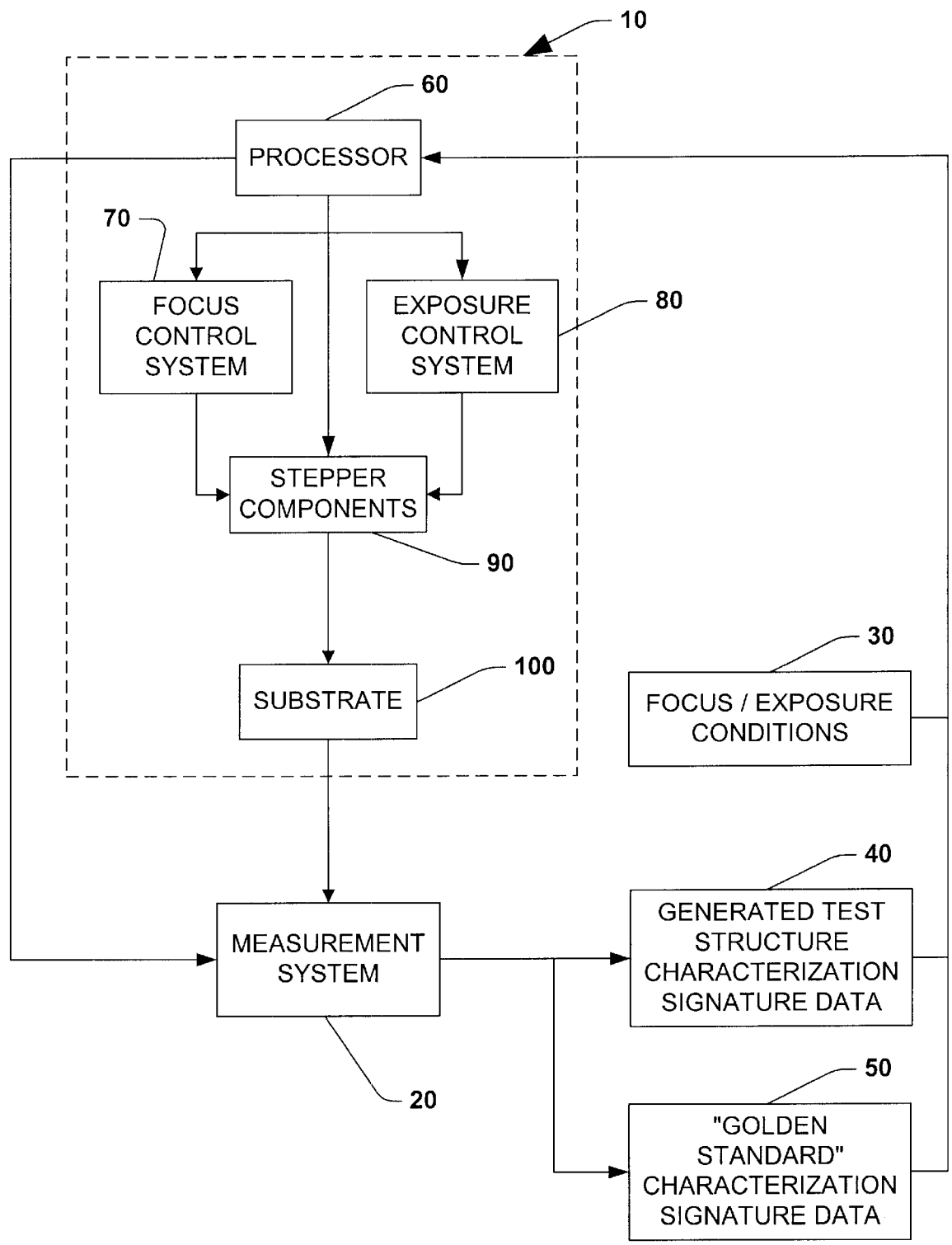
FIG. 1 is a schematic block diagram illustrating an exemplary stepper and measurement system according to the present invention.

The present invention will now be described with reference to the drawings wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details. In other instances, well-known structures and devices are shown in block diagram form in order to facilitate description of the present invention.

In the present invention, a system and method will be described with reference to the calibration of a stepper system wherein the detection of a test structure formed on a substrate employs a measurement system such as scatterometry. In accordance with one aspect of the present invention, a stepper system is employed to print test structures, for example, a grating, at a plurality of focus and exposure conditions, thereby generating a plurality of test structures. Each of the test structures has feature characteristics which are a function of their associated focus and exposure conditions employed in generating the test structure. Each of the test structures is then characterized, for example, using scatterometry, to generate characterization data associated therewith. The characterization data is then compared to an ideal characterization signature representing desired ideal feature characteristics. For example, correlation is employed between the generated characterization data and the ideal characterization signature data to determine an optimal focus and exposure condition according to a predetermined criteria. Calibrating the focus and exposure conditions to an ideal, or "golden standard", before the beginning of a production run facilitates achieving desired critical dimensions at startup.

Referring now to the figures, several aspects of the present invention are presented. FIGS. 1–5 of the present invention illustrate a system utilizing a measurement system for characterizing the structural profile of test structures formed on a substrate to calibrate focus and exposure settings in a stepper system, thereby optimizing processing and performance of semiconductor devices.

FIG. 1 is a block diagram of an exemplary lithography system using a measurement system to characterize a test structure. The system of FIG. 1 employs a stepper system 10, a measurement system 20, a memory containing a plurality of focus and exposure conditions 30, a memory containing generated test structure characterization data 40, a memory containing ideal "golden standard" characterization signature data 50, and a processor 60 associated therewith to characterize the test structure and determine an optimal focus and exposure condition, based at least partly on a comparison of the generated test structure characterization data 40 to the "golden standard" characterization signature data 50. Although FIG. 1 illustrates the processor 60 as a part of the stepper system 10, another aspect of the present invention comprises a processor external to the stepper system being employed to act either in conjunction with, or in place of, the stepper system processor 60. The stepper system 10 also comprises a focus control system 70 and an exposure control system 80 to control one or more stepper components 90 which produce a pattern on a substrate 100 such as a wafer.

According to one exemplary aspect of the present invention, the stepper system 10 is employed to produce a plurality of test structures on a wafer 100 which are exposed employing the plurality of focus and exposure conditions stored in the memory 30. The measurement system 20 characterizes the test structures (e.g., using scatterometry) and stores in the memory 40 the test structure characterization signature data. The processor 60 compares each of the test structure characterization signature data sets 40 with an ideal "golden standard" structure data set stored in the memory 50. One of the test structure characterization signature data sets is selected based on the comparison using some predetermined criteria. For example, the test structure data set which most closely correlates to the "golden standard" data set 50 is selected, and the focus and exposure condition associated with the selected test structure data is then employed in the stepper system 10 via the focus control system 70 and the exposure control system 80, respectively. Although separate memories 30, 40, and 50 for each data set are described in this exemplary system, any number of memories are contemplated as falling within the scope of the present invention, including a single memory associated with the entire system.

Figure 2:
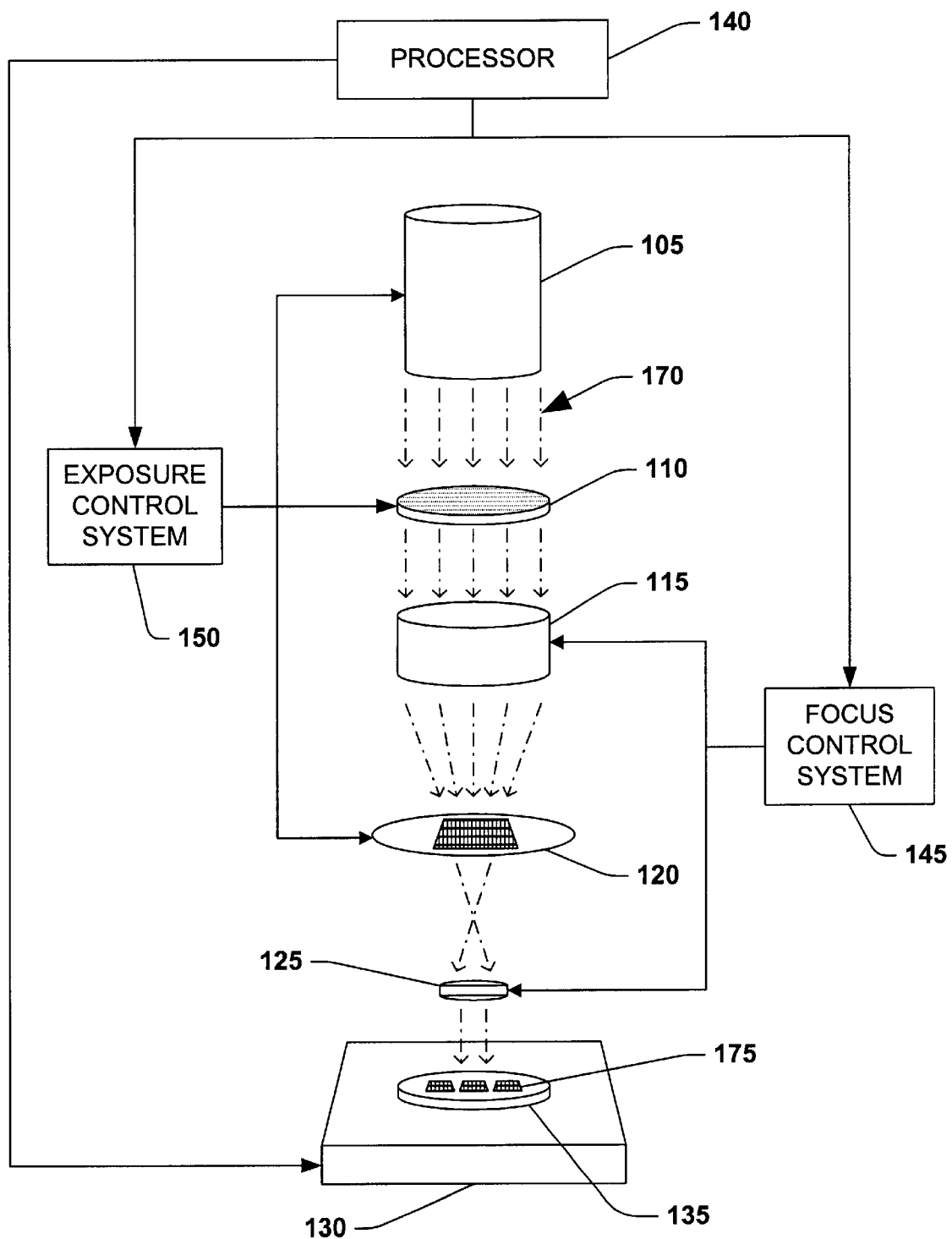
FIG. 2 is a partial schematic illustration of an exemplary stepper system according to the present invention.

FIG. 2 is a partial schematic illustration which further describes an exemplary stepper system which can be employed in the current invention. It is to be appreciated that the system shown in FIG. 2 is not necessarily drawn to scale to illustrate the teachings of this invention. The stepper system of FIG. 2 is comprised of an illumination source 105 which produces illumination 170 (e.g., ultraviolet light) that may be controlled by modulating power supplied to the illumination source 105. The stepper system may also comprise an illumination modification filter 110 (e.g., a pupil filter) which may be employed to spatially modulate the intensity and/or phase of the illumination 170.

The exemplary stepper system may also include a condenser lens system 115 and a reduction lens system 125, each of which may be controlled (e.g., vertical position) to adjust a focus of the illumination 170 passing through the condenser lens system 115 and reduction lens system 125. The stepper system also includes a mask/reticle 120, which is employed to expose a test pattern 175 (e.g., a grating) on a substrate 135 such as a wafer. A focus control system 145 can be operatively connected to one or more of the condenser lens system 115 and reduction lens system 125 to control focus parameters within the stepper system. In addition, an exposure control system 150 is operatively connected to one or more of the illumination source 105, the illumination modification filter 110, and the mask/reticle 120 to control exposure of the substrate 135 to a light emitted by the illumination source 105. The focus control system 145 and the exposure control system 150 are operatively connected to a processor 140 which controls one or more settings for the stepper system. A stage 130 which may be indexed or "stepped" via the processor 140 adjusts the location of the illumination exposure 170 onto the substrate 135 situated therein.

Figure 3:
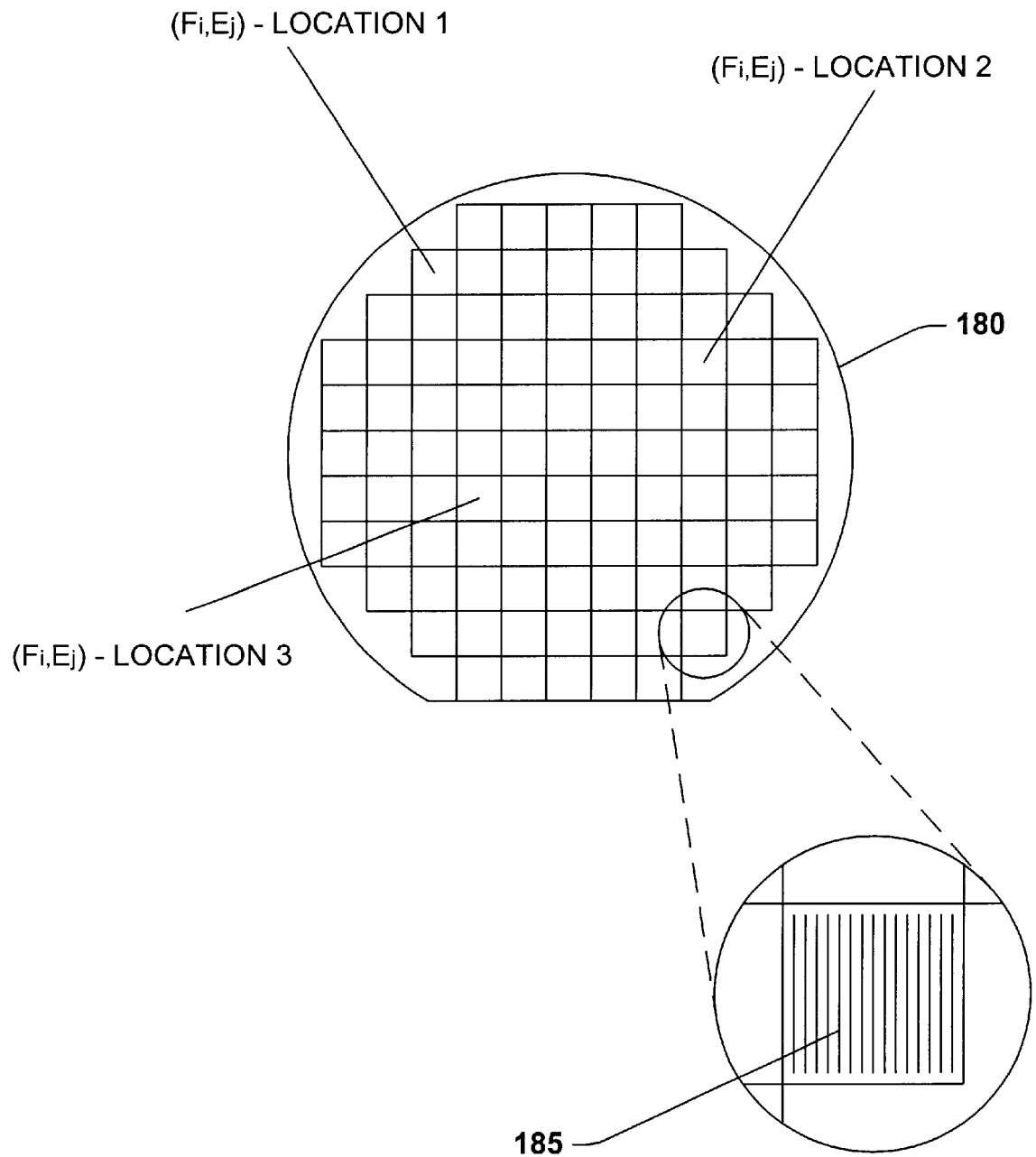
FIG. 3 is a schematic illustration of an exemplary wafer having a plurality of test structures which have been formed under a variety of focus and exposure conditions.

FIG. 3 illustrates an exemplary sample wafer 180 which contains a plurality of test structures 185 (e.g., gratings) which have been exposed within the stepper system using a plurality of focus and exposure settings. In accordance with one aspect of the present invention, the wafer 180 may be divided into a grid pattern, with each grid block location corresponding to a particular portion of the wafer 180, and further corresponding to a particular focus and exposure setting (F,E). The respective portions of the wafer 180 are denoted as $F_i,E_j$ where i equals 1 through m, the total number of focus conditions, and j equals 1 through n, the total number of exposure conditions. In one exemplary aspect of the present invention, each test structure 185 is exposed using a unique focus and exposure condition, and the total number of test structures is based upon the total number of focus and exposure settings entered into the processor.

According to another exemplary aspect of the invention, exposure conditions can be held constant, while only focus conditions are varied when forming the test structures. In yet another aspect of the invention, the focus conditions can be held constant while only the exposure conditions are varied when forming the test structures. Any combination of focus and exposure settings can be implemented to achieve a desired wafer for system calibration. The selection of the range focus and exposure conditions may vary, and such variations are contemplated as falling within the scope of the present invention.

Referring again to FIG. 1, a measurement system 20 is employed to characterize the generated test structures on the substrate 100. One exemplary measurement system which can be employed to characterize test structures such as gratings on a substrate 100 is scatterometry. Scatterometry is a technique for extracting information about a surface that involves directing a nearly collimated light beam (e.g., laser) on an area to be characterized and measuring the angular distribution of the light that is elastically scattered from that area. Information concerning properties including, but not limited to, profile, line width, dishing, erosion, thickness of thin films, and critical dimensions of features present on a surface such as a wafer can be extracted. The information can be extracted by comparing the phase and/or intensity signals of the light directed onto the surface with phase and/or intensity signals of a complex reflected and/or diffracted light resulting from the incident light reflecting from and/or diffracting through the surface upon which the incident light was directed. The intensity and/or phase of the reflected and/or diffracted light will change based on properties of the surface upon which the light is directed.

Different combinations of the above-mentioned properties will have different effects on the phase and/or intensity of the incident light resulting in substantially unique intensity/phase signatures in the complex reflected and/or diffracted light. Thus, by examining a signal (signature) of intensity/phase signatures, a determination can be made concerning the properties of the surface. By way of illustration, when exposed to a particular incident light of known intensity, wavelength and phase, an ideal "golden standard" structure on a wafer can generate an ideal phase/intensity signature. Similarly, when exposed to the same particular incident light of known intensity, wavelength and phase, a test structure on a wafer can generate a test structure phase/intensity signature. For example, a line formed on a wafer having optimal focus and exposure conditions may generate an optimal signature while a line formed on a wafer having non-optimal focus and exposure conditions may generate a second signature. In one exemplary aspect of the present invention, ideal "golden standard" characterization signatures are stored in a signal (signature) database containing a plurality of phase/intensity signatures for various desired feature shapes. Thus, when the phase/intensity signals for test structures are received from scatterometry detecting components, the phase/intensity signals can be pattern matched, for example, to the database of signals to determine whether the signals correspond to a stored signature for the desired feature shape.

Figure 4:
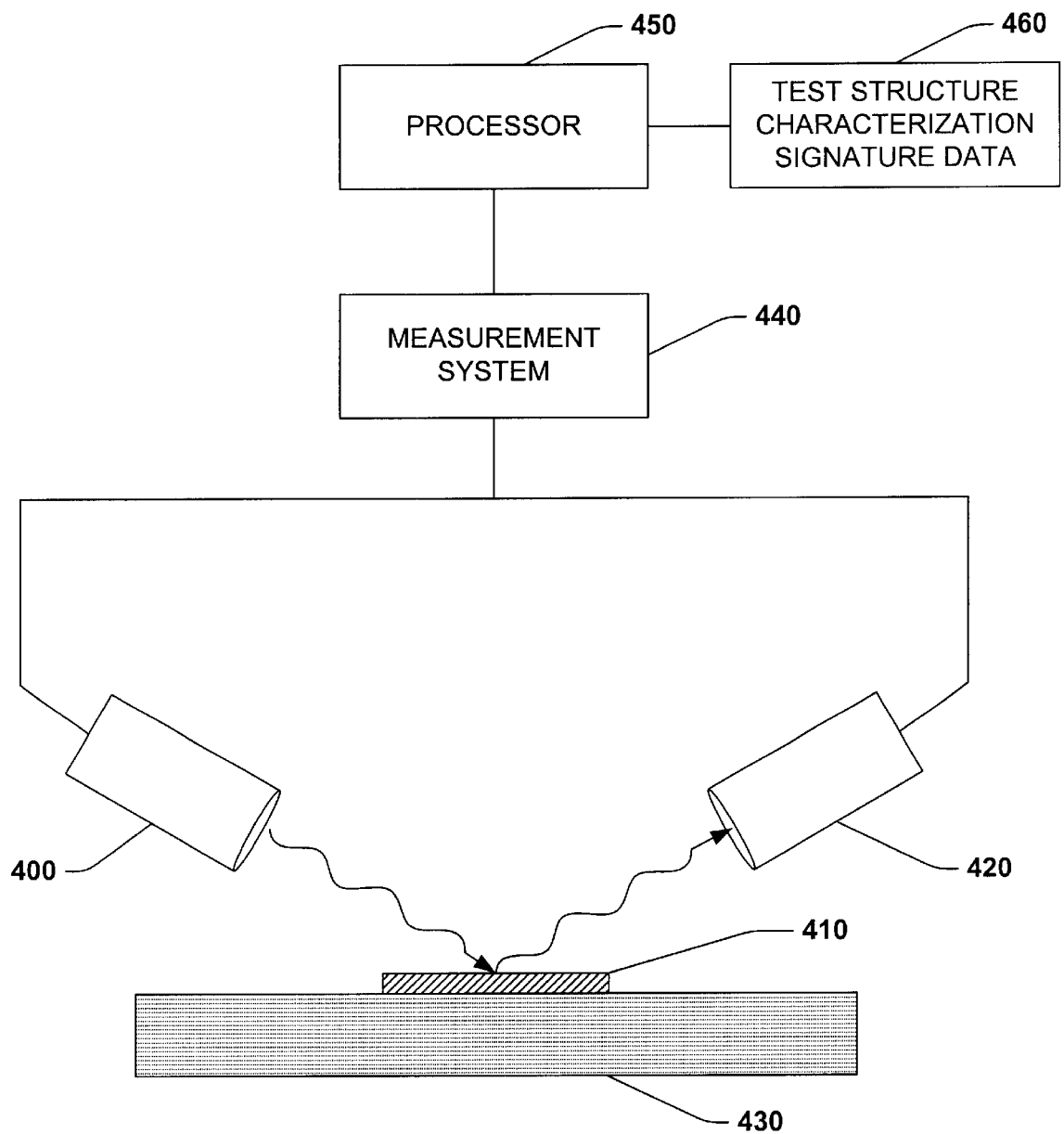
FIG. 4 is a schematic block diagram illustrating an exemplary measurement and characterization system according to the present invention.

An example of a scatterometer system suitable for the characterization process is shown in FIG. 4. An exemplary scatterometry system 440 may employ one or more light sources 400 arranged to project light on respective portions of a test structure 410, and one or more light detecting devices 420 to collect light reflected by the test structure 410. The one or more detecting devices 420 detect a reflected beam, and the processor system 450 which is operatively coupled to the one or more light sources 400 and the one or more detecting devices 420 calculates a power spectral density (PSD) as a function of spatial frequency. The PSD is stored in a memory as the generated test structure characterization signature data 460, and is a measure of scattered power per unit of spatial frequency.

Figure 5:
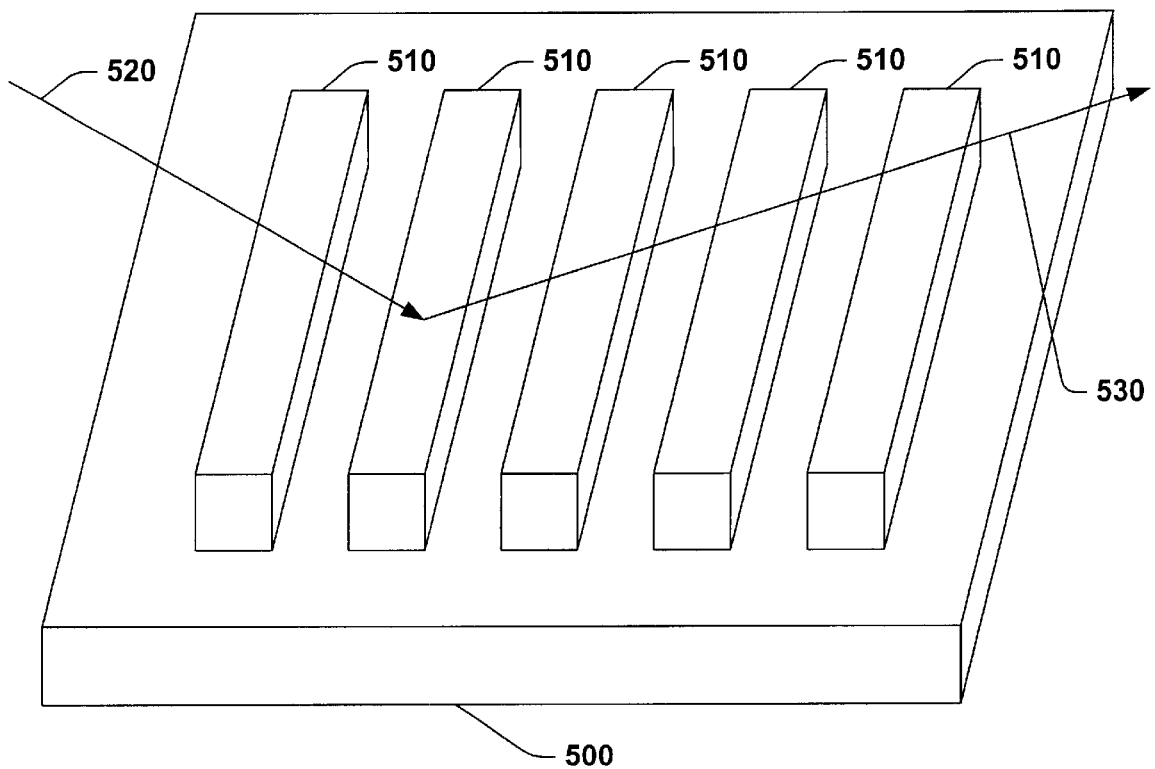
FIG. 5 is a simplified perspective view of an incident light reflecting off an exemplary characterization test structure.

Phase signals and intensity signals are recorded from a complex reflected and refracted light which is produced when an incident light is directed onto a wafer surface. Referring to FIG. 5, an incident light 520 is directed at a surface 500, upon which one or more features 510 may exist. The incident light 520 is reflected as reflected light 530. The properties of the surface 500, including but not limited to, thickness, uniformity, planarity, chemical composition and the presence of features, can affect the reflected light 530. The illustrated features 510 are raised upon the surface 500, depicting an exemplary grating test structure formation.

Figure 6:
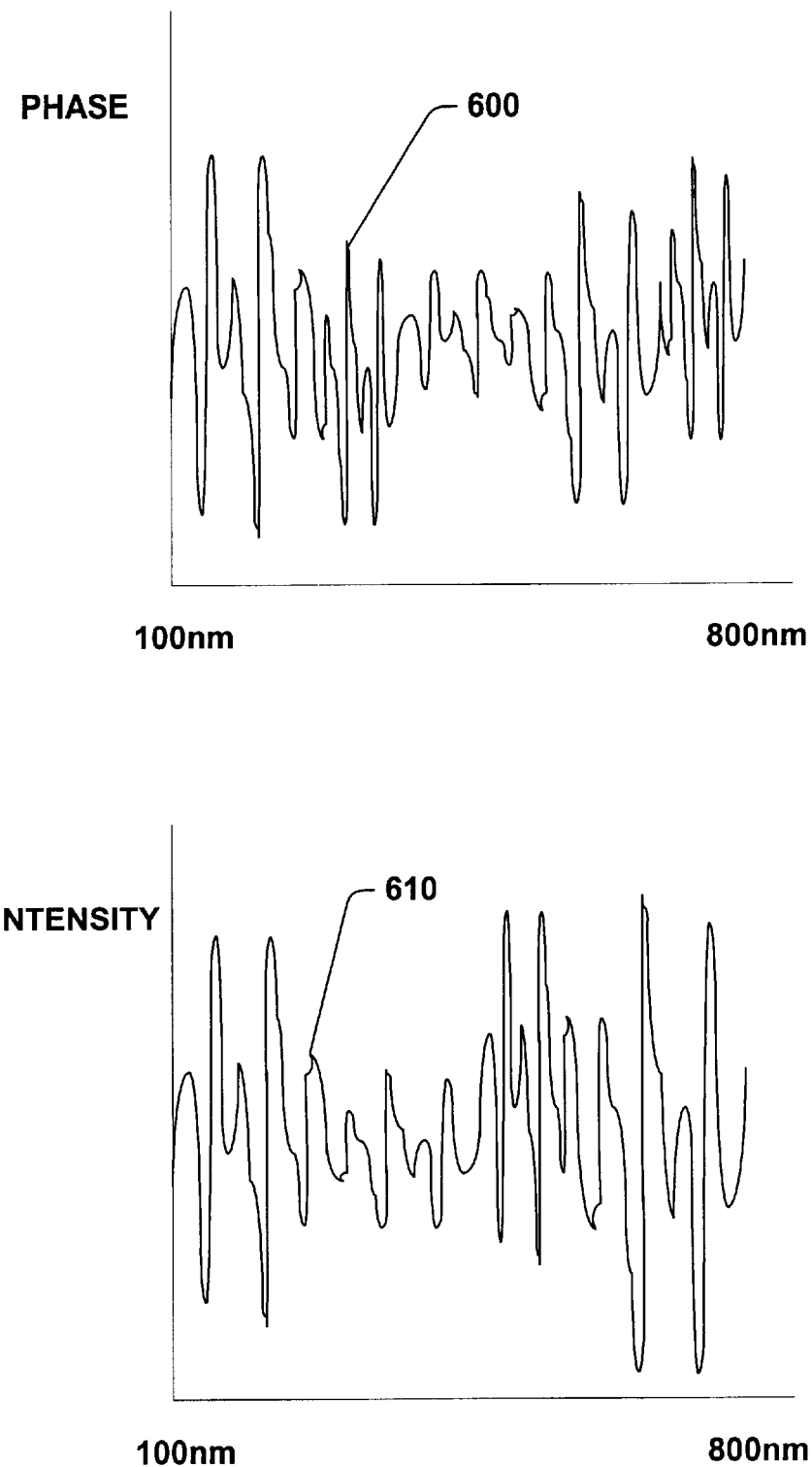
FIG. 6 is an illustration of exemplary phase and intensity signals recorded from a complex reflected and refracted light produced when an incident light is directed onto a wafer surface, in accordance with an aspect of the present invention.

The phase and intensity of the reflected light 530 can be measured and plotted, as shown, for example, in FIG. 6. The phase 600 of the reflected light 530 may be plotted, as may the intensity 610 of the reflected light 530 as a function of wavelength. Such plots may be employed to compare generated test structure characterization signatures with ideal "golden standard" characterization signatures stored in "golden standard" signature database using correlation techniques or like pattern matching, for example.

Again referring to FIG. 1, the generated test structure characterization data 40 is then used to calibrate the stepper system 10 of by comparing the generated test structure characterization data 40 to the ideal "golden standard" characterization signature data 50. That is, each of the sets of characterization data uniquely identify test structures having a unique focus and exposure condition associated therewith. Each of the characterization data sets are compared to a "golden standard" data set associated with an ideal "desired" structure, and one of the data sets is selected based on the comparison using some predetermined criteria. For example, the characterization data set which most closely correlates to the "golden standard" data set is selected. The focus and exposure condition associated wit the selected data set is then employed in the stepper system via the focus control system 70 and the exposure control system 80, respectively.

Alternatively, one or more incident beams of light may be directed at a side associated with a test structure either in succession or simultaneously. In another aspect of the present invention, one or more detectors may be used to collect relevant data. In yet another aspect of the present invention, the light source 400 may be stationary with respect to the stage 430. In still another aspect of the present invention, the light source 400 may be non-stationary with respect to the stage 430 such that the detector 420 detects reflected light at timed intervals as the light source 400 rotates around the test structure 410.

Figure 7:
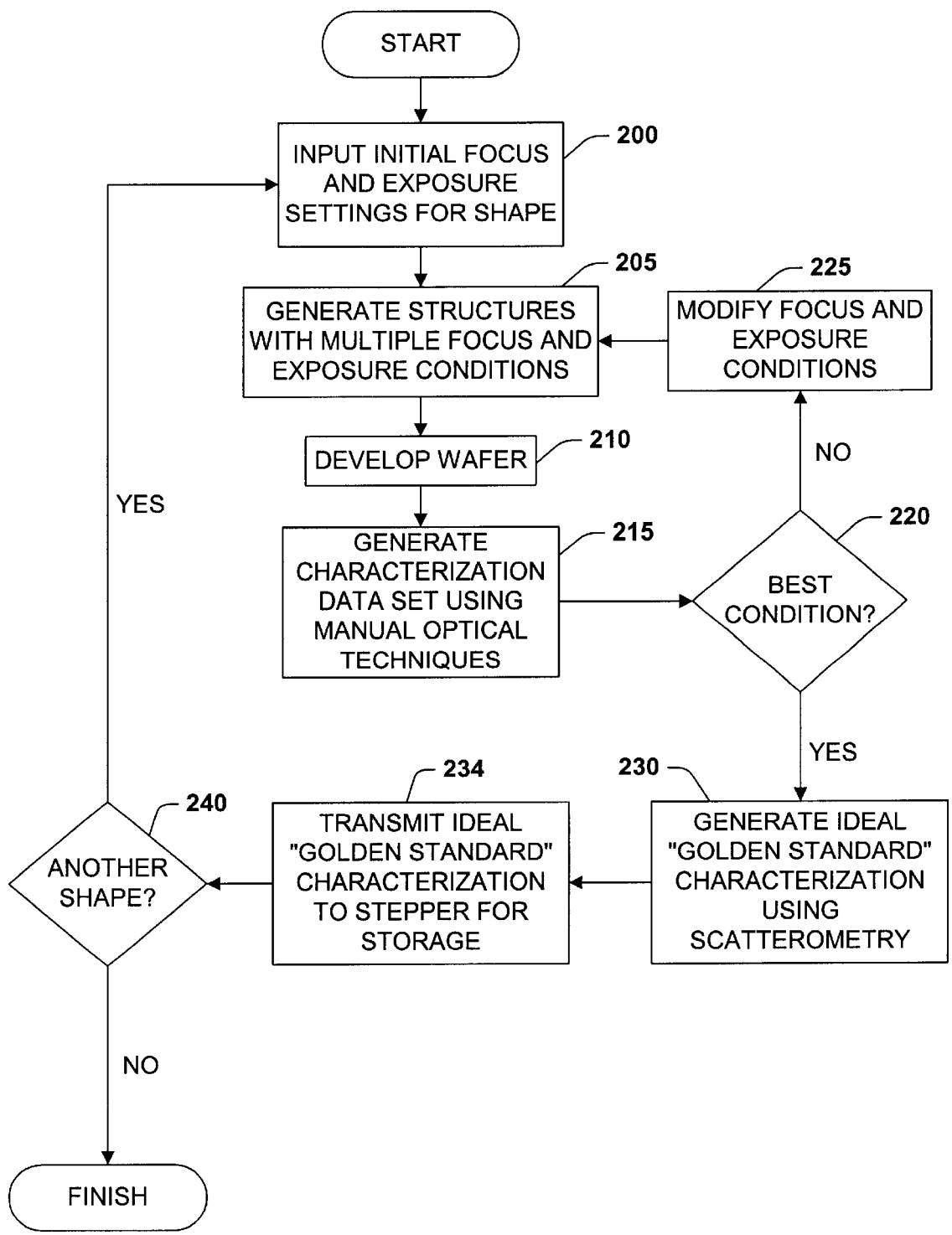
FIG. 7 is a flow chart illustrating a method for generating calibration test structures on a wafer, characterizing the calibration test structures using a measurement system such as scatterometry, correlating the test structure scatterometry data to an ideal set of data, and transmitting the best correlation focus and exposure settings to the stepper.

In accordance with another aspect of the present invention, a method of identifying optimal focus and exposure conditions for calibrating a stepper system is disclosed. Initially, FIG. 7 depicts a flow chart illustrating an exemplary method of obtaining an ideal calibration signature, or "golden standard" characterization signature in a stepper system according to the present invention. To obtain such a calibration signature, a stepper system generates a plurality of test structures (e.g., gratings) on a wafer at step 205 based on a plurality of focus and exposure conditions 200 for a particular desired feature shape (e.g., critical dimension, height, line width). The exposed wafer is then developed at step 210 using standard lithography processes. The test structures are characterized using, for example, manual optical techniques at step 215 (e.g., optical microscope, scanning electron microscope), and the characterization data set is analyzed to determine if it can be considered ideal at step 220 for the particular feature shape. If the characterization does not identify an ideal structure at step 220, focus and exposure conditions are modified accordingly at step 225, and the test structure generation process at step 205 is repeated. If the subsequent characterization generates an ideal structure at step 220, an ideal or "golden standard" characterization is performed using a measurement system such as a scatterometry system at step 230. The "golden standard" characterization signature for the desired feature shape is further sent to the stepper for storage in memory at step 235. If a characterization of another feature shape is desired at step 240, then the entire process is repeated until all feature shapes are characterized by scatterometry. After all feature shapes are characterized, the "golden standard" characterization signature calibration is complete.

Figure 8:
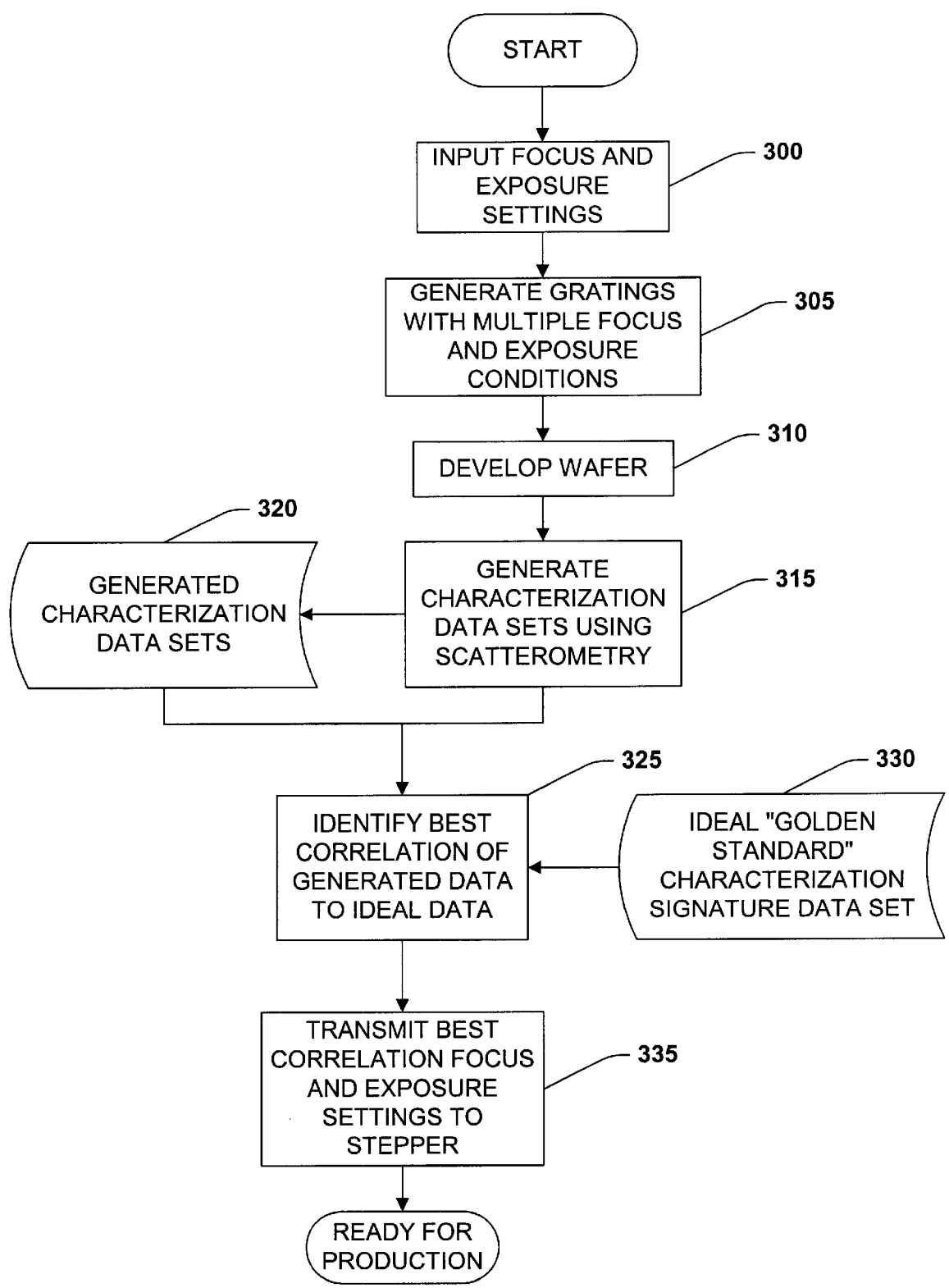
FIG. 8 is a flow chart illustrating a method for generating calibration test structures on a wafer, characterizing the calibration test structures using manual optical techniques, determining a best condition from the data, characterizing the best condition test structure using scatterometry, and transmitting the scatterometry characterization data to the stepper for storage.

FIG. 8 depicts a flow chart illustrating an exemplary method of calibrating a stepper system according to the present invention. To perform such a calibration, a stepper system generates a plurality of test structures at step 305 (e.g., gratings) on a substrate (e.g., wafer) using a plurality of focus and exposure conditions at step 300 which are input to the stepper. Therefore, each of the test structures have profiles and other characteristics which are uniquely associated with their respective focus and exposure condition. The wafer is then developed at step 310 using standard lithographic techniques. The test structures are further characterized using a measurement system such as a scatterometry system at step 315, and the characterization data sets for each of the test structures are stored in a database at step 320. After all the test structures are characterized, the characterization data corresponding to each focus and exposure condition is compared (e.g., via correlation) to the ideal characterization or "golden standard" characterization signature data set at step 330 (e.g., which has been input to the processor from the method illustrated in FIG. 7). An optimal focus and exposure condition is then determined by the comparison at step 325, and the optimal focus and exposure condition is sent to the stepper at step 335 for use as a calibrated setting for the stepper system, and the calibration is complete.

Although the invention has been shown and described with respect to certain aspects, equivalent alterations and modifications will occur to others skilled in the art upon the reading and understanding of this specification and the annexed drawings. In particular regard to the various functions performed by the above described components (systems, devices, assemblies, etc.), the terms used to describe such components are intended to correspond, unless otherwise indicated, to any component which performs the specified function of the described component (i.e., that is functionally equivalent), even though not structurally equivalent to the disclosed structure that performs the function in the herein illustrated exemplary aspects of the invention. In addition, while a particular feature of the invention may have been disclosed with respect to only one of several aspects, such feature may be combined with one or more other features of the other aspects as may be desired and advantageous for any given or particular application. Furthermore, to the extent that the term "includes" is used in either the detailed description and the claims, such term is intended to be inclusive in a manner similar to the term "comprising."

What is claimed is:

1. A system for calibrating lithography system settings in semiconductor manufacturing, comprising:
    a stepper system adapted to generate a plurality of test structures on a substrate, the stepper system further comprising:
        an illumination source for exposing the substrate within the stepper system;
        an illumination filter for varying the illumination being exposed to the substrate;
        one or more lenses for directing and focusing the illumination onto the substrate;
        a mask/reticle containing a test structure thereon for exposing an image of the test structure on the substrate; and
        a stage for the placement of the substrate to be exposed;
    a focus control system for varying focus parameters within the stepper system;
    an exposure control system for varying exposure parameters within the stepper system;
    a developing system for developing an exposed substrate;
    a measurement system adapted to characterize the plurality of generated test structures, thereby generating test structure characterization data associated with the plurality of test structures;
    a first memory for collecting and retaining a base set of ideal test structure characterization data;
    a second memory for collecting and retaining the generated test structure characterization data from the measurement system;
    a third memory for collecting and retaining a plurality of focus and exposure conditions; and a processor operatively associated with the stepper system, the focus control system, the exposure control system, the measurement system, the first memory, the second memory, and the third memory, and operable to control the stepper system, focus control system, exposure control system and developing system to generate the plurality of test structures, wherein each of the test structures is associated with a unique focus and exposure condition, and further operable to compare the generated test structure characterization data to the ideal test structure characterization data, to determine an optimal focus and exposure condition based on the comparison of the plurality of the generated test structure characterization data to the ideal test structure characterization data, wherein the optimal focus and exposure condition is the focus and exposure condition associated with the generated test structure having characterization data that comprises a closest match to the ideal test structure characterization data, and to employ the determined optimal focus and exposure condition in the stepper system via the focus control system and the exposure control system, respectively.

2. The system of claim 1, wherein the measurement system further comprises a scatterometry system.

3. The system of claim 2, wherein the scatterometry system is operable to generate an incident light beam onto the test structures and detect reflected or diffracted light having an intensity profile and phase profile associated therewith, and wherein the intensity profile or the phase profile or both are utilized to characterize each of the plurality of test structures.

4. The system of claim 2, wherein the scatterometry system comprises one or more light sources, one or more detectors, and a processor system having a memory and a processor associated therewith.

5. The system of claim 4, wherein the processor associated with the scatterometry system is operable to calculate a power spectral density function associated with each of the test structures using the intensity profile, the phase profile, or both associated with each of the test structures, respectively.

6. The system of claim 1, wherein the first memory, the second memory, and the third memory are the same physical memory with different associated memory addresses.

7. The system of claim 1, wherein the processor comprises a one or more processors with associated memory.

8. The system of claim 1, wherein the test structures each comprise a diffraction grating.

9. The system of claim 1, wherein the processor is operable to determine an optimal focus and exposure condition via comparing the generated test structure characterization data to the ideal test structure characterization data by performing a correlation between each of the sets of generated test structure characterization data and the ideal test structure characterization data, and selecting a set of generated test structure characterization data which most closely correlates to the ideal test structure characterization data.

10. A system for calibrating lithography system settings in semiconductor manufacturing, comprising:

a stepper system adapted to generate a plurality of test structures associated with different focus and exposure conditions on a substrate;

a focus control system for varying focus parameters within the stepper system;

an exposure control system for varying exposure parameters within the stepper system;

a developing system for developing an exposed substrate;

a memory for collecting and retaining focus and exposure conditions;

a measurement system adapted to characterize the plurality of generated test structures, thereby generating test structure characterization data associated with the focus and exposure conditions of each test structure;

a processor operatively associated with the stepper system, the focus control system, the exposure control system, the memory, and the measurement system, and operable to control the stepper system, focus control system, exposure control system and developing system to generate the plurality of test structures, wherein each of the test structures is associated with a unique focus and exposure condition, and further operable to compare the generated test structure characterization data to an ideal test structure characterization data, to determine an optimal focus and exposure condition based on the comparison of the plurality of the generated test structure characterization data to the ideal test structure characterization data, wherein the optimal focus and exposure condition is the focus and exposure condition associated with the generated test structure having characterization data that comprises a closest match to the ideal test structure characterization data, and to employ the focus and exposure condition in the stepper system via the focus control system and the exposure control system respectively.

11. The system of claim 10, wherein the stepper system further comprises:

an illumination source for exposing the substrate within the stepper system;

an illumination filter for varying the illumination being exposed to the substrate;

one or more sets of lenses for directing and focusing the illumination onto the substrate;

a mask/reticle for exposing a test structure image on a substrate; and a stage for the placement of the substrate to be exposed.

12. The system of claim 10, wherein the measurement system further comprises a scatterometry system.

13. The system of claim 12, wherein the scatterometry system is operable to generate an incident light beam onto the test structures and detect reflected or diffracted light having an intensity profile and phase profile associated therewith, and wherein the intensity profile or the phase profile or both are utilized to characterize each of the plurality of test structures.

14. The system of claim 12, wherein the scatterometry system comprises one or more light sources, one or more detectors, and a processor system having a memory and a processor associated therewith.

15. The system of claim 14, wherein the processor associated with the scatterometry system is operable to calculate a power spectral density function associated with each of the test structures using the intensity profile, the phase profile, or both associated with each of the test structures, respectively.

16. The system of claim 10, wherein the measurement system comprises a first memory for collecting and retaining a base set of ideal test structure characterization data, and a second memory for collecting and retaining the generated test structure characterization data.

17. The system of claim 16, wherein the first memory and second memory are the same physical memory with different associated memory addresses.

18. The system of claim 10, wherein the processor comprises one or more processors with associated memory.

19. The system of claim 10, wherein the test structures are a diffraction gratings.

20. A method for determining an optimal focus and exposure setting for a lithography stepper system, comprising:
   generating a plurality of test structures on a substrate using lithography techniques, wherein each of the test structures are associated with a unique one of a plurality of focus and exposure conditions;
   characterizing the plurality of generated test structures and obtaining a generated characterization data set for each focus and exposure condition;
   storing the generated characterization data sets in a memory;
   entering ideal characterization signature data into a processor which stores the ideal characterization signature data in a memory;
   comparing the plurality of generated characterization data sets and the ideal characterization signature data; and
   identifying an optimal focus and exposure setting based on the comparison of the generated characterization data and idea characterization signature data, wherein the optimal focus and exposure condition is associated with generated test structure having a characterization data set which comprises a closest match to the ideal characterization signature.

21. The method of claim 20, further comprising the step of transmitting the focus and exposure settings of the identified optimal focus and exposure setting to the stepper.

22. The method of claim 20, wherein generating a plurality of test structures comprises:
   placing a wafer onto a stage in the stepper system;
   setting focus and exposure conditions in the stepper system;
   moving the stage to a predetermined location for exposing a test structure;
   exposing the wafer with illumination from the stepper system;
   stepping the stage to a next predetermined location;
   modifying focus and exposure conditions in the stepper system;
   repeating the exposing, stepping, and modifying processes until a predetermined number of test structures have been exposed; and
   developing the exposed test structures.

23. The method of claim 20, wherein characterizing the plurality of generated test structures is performed using scatterometry techniques.

24. The method of claim 23, wherein the scatterometry system generates an incident light beam onto the test structures and detects reflected or diffracted light having an intensity profile and phase profile associated therewith, and wherein the intensity profile or the phase profile or both are utilized to characterize each of the plurality of test structures.

25. The system of claim 24, wherein the scatterometry system calculates a power spectral density function associated with each of the test structures using the intensity profile, the phase profile, or both associated with each of the test structures, respectively.

26. The method of claim 20, wherein the ideal feature characterization data is obtained using scatterometry techniques.

27. The method of claim 20, wherein the modification of focus and exposure settings is manually controlled by an operator.

28. The method of claim 20, wherein the modification of focus and exposure settings is automatically controlled by a processor.

29. The method of claim 20, wherein the test structures are diffraction gratings.

30. The method of claim 20, wherein the characterization signatures are generated corresponding to multiple test structure shapes.

31. The method of claim 20, wherein the comparison study is a correlation study.

* * * * *